United States Patent
Yoon

(10) Patent No.: US 11,329,602 B2
(45) Date of Patent: May 10, 2022

(54) DEVICE AND METHOD FOR SIMULATING POWER CONSUMPTION BY POWER LOAD

(71) Applicant: HYMATICS, INC., Seongnam-si (KR)

(72) Inventor: Hyeong Seob Yoon, Seoul (KR)

(73) Assignee: HYMATICS, INC., Seongnam-si (KR)

( * ) Notice: Subject to any disclaimer, the term of this patent is extended or adjusted under 35 U.S.C. 154(b) by 337 days.

(21) Appl. No.: 16/643,291

(22) PCT Filed: Jul. 12, 2018

(86) PCT No.: PCT/KR2018/007921
§ 371 (c)(1),
(2) Date: Feb. 28, 2020

(87) PCT Pub. No.: WO2019/045262
PCT Pub. Date: Mar. 7, 2019

(65) Prior Publication Data
US 2020/0204110 A1    Jun. 25, 2020

(30) Foreign Application Priority Data

Aug. 31, 2017    (KR) .................. 10-2017-0110571

(51) Int. Cl.
| | |
|---|---|
| *H02S 40/38* | (2014.01) |
| *H01L 31/042* | (2014.01) |
| *H02J 3/38* | (2006.01) |
| *H02S 50/00* | (2014.01) |

(52) U.S. Cl.
CPC .......... *H02S 40/38* (2014.12); *H01L 31/042* (2013.01); *H02J 3/38* (2013.01); *H02S 50/00* (2013.01)

(58) Field of Classification Search
CPC ....... H02S 40/38; H02S 50/00; H01L 31/042; H02J 3/38
See application file for complete search history.

(56) References Cited

FOREIGN PATENT DOCUMENTS

| | | |
|---|---|---|
| JP | 2011-150468 A | 8/2011 |
| JP | 4938750 B2 | 5/2012 |
| KR | 10-1269587 B1 | 6/2013 |
| KR | 10-2015-0051754 A | 5/2015 |
| KR | 10-2015-0137190 A | 12/2015 |

OTHER PUBLICATIONS

International Search Report dated Oct. 5, 2018, corresponding to International Application No. PCT/KR2018/007921 citing the above reference(s).

*Primary Examiner* — Robert L Deberadinis
(74) *Attorney, Agent, or Firm* — Hauptman Ham, LLP

(57) ABSTRACT

The present invention relates to a device and method for simulating the power consumption by a power load, which uses data collected over a long period of time on the inclined insolation, the horizontal insolation, the external temperature, the photovoltaic module temperature, the solar power generation facilities and generated solar power corresponding to the solar power generation facilities for each region. The device and method of the present invention simulates or estimates the power consumption by power loads provided by a user and shows a result of the simulation when a user desires to design or build a renewable solar power energy system.

8 Claims, 6 Drawing Sheets

DEVICE AND METHOD FOR SIMULATING POWER CONSUMPTION BY POWER LOAD

CROSS-REFERENCE TO RELATED APPLICATION

The present application is a national stage filing under 35 U.S.C § 371 of PCT application number PCT/KR2018/007921 filed on Jul. 12, 2018 which is based upon and claims the benefit of priority to Korean Patent Application No. 10-2017-0110571 filed on Aug. 31, 2017, in the Korean Intellectual Property Office, which is incorporated herein in its entirety by reference.

TECHNICAL FIELD

The present invention relates to a device and a method for simulating power consumption by power load. More specifically, using data collected over a long period of time on inclined insolation, horizontal insolation, external temperature, photovoltaic module temperature, solar power generation facility and generated solar power corresponding to the solar power generation facility, the device and method of the present invention simulates or estimates the power consumption by power loads provided by a user and shows a result of the simulation when a user desires to design or build a renewable solar power energy system.

BACKGROUND ART

Recently, demand for electric power has been increasing year by year due to industrial development. Accordingly, installation of a renewable energy system including an energy storage system (ESS) is being promoted in houses, condominiums, buildings, and factories on a nation-wide scale.

As an example, as shown in FIG. 1, a renewable, in-house solar power energy system includes AC power supply system 10, a smart meter 15, a solar power generation facility 20, and an energy storage system (ESS) 30, a distribution board 40, a home appliance 50 which is a power load, and a home energy management system (HEMS) 60.

The smart meter 15 includes a detection unit for measuring a received power P1 from the AC power supply system 10 and calculating related values such as power factor, lagging reactive power and leading reactive power. The smart meter 15 also includes a wired or wireless communication module for transmitting the power related information to the home energy management system (HEMS) 60.

The solar power generation facility 20 includes photovoltaic modules 21 of a maximum power point tracking (MPPT) type and inverters 22 respectively connected to a DC output terminal of each photovoltaic module 21 for performing power generation.

The energy storage system (ESS) 30 includes a bi-directional converter 32 for charging and discharging the battery 33 and a bi-directional inverter 31 for transmitting power from the battery 33 to the AC power supply system 10 and charging the battery 33 with the power from the AC power supply system 10, a battery for storing electricity 33, a battery management system (BMS) 34, a controller 35, and a communication interface module for transmitting and receiving data via wired or wireless communications 36.

The battery management system (BMS) 34 transmits information about the battery charge and battery temperature to the controller 35, and the communication interface module 36 connected to the controller 35 transmits the battery charge data to the home energy management system (HEMS) 60 via the wired or wireless communication. The controller 35 receives from the home energy management system (HEMS) 60 a reference value of current compensation to be performed by the energy storage system (ESS) 30 and supplies a compensation current to its output P2 to perform a voltage compensation or power factor compensation.

The distribution board 40 is connected between the output of the inverter 22 in the solar power generation facility 20 and the output of the bi-directional inverter 31 of the energy storage system (ESS) 30. The home energy management system (HEMS) 60 collects and stores information on the power consumption P1 using the AC power supply system 10 and charge and discharge power P2 of the battery 33 of the energy storage system (ESS) 30, and controls the overall energy storage system (ESS) 30.

In order to provide a renewable solar power energy system having the energy storage system (ESS) to a house, a condominium, a building, or a factory, a user needs to determine the magnitude of inverter output of the solar power generation facility 20 and determine the battery charging and discharging capacity. Based on the determined data, the user also needs to estimate or predict how many power loads such as home appliances 50 can be installed and how much power will be consumed in the power loads.

However, the power consumption by the power load differs depending on the insolation and temperature, as well as the performance of the solar power generation facility and the energy storage system (ESS) in each geographical region. Therefore, it is difficult to estimate or predict the power consumption by the power load with the conventional solar power generation simulation devices, and if possible, the reliability and accuracy of the estimation or prediction is not enough.

DISCLOSURE OF INVENTION

Problem to be Solved by the Invention

The present invention is proposed in order to solve the above-mentioned problems. Using data collected over a long period of time on inclined insolation, horizontal insolation, external temperature, photovoltaic module temperature, solar power generation facility and generated solar power corresponding to the solar power generation facility, the device and method of the present invention simulates or estimates the power consumption by power loads to be used by a user and shows a result of the simulation when the user intends to design or build a renewable solar power energy system at a desired geographical region.

The other objects of the present invention will be easily understood by the description of the following embodiments of the present invention.

Means for Solving the Problem

In order to solve the above problems, there is provided a device for simulating power consumption by power load comprising: a user input unit for receiving user instructions; a display unit; a data storage unit for storing data including inclined insolation and horizontal insolation, external temperature, photovoltaic module temperature, solar power generation facility and generated solar power corresponding to the solar power generation facility measured in various geographical regions within a certain period of time; a data input processing unit for outputting a data input screen on the display unit and receiving data regarding energy storage system, power load and AC power supply system from the user input unit; a data retrieval processing unit configured to use information on a solar power generation facility and a geographical region where the solar power generation facility is to be installed, for retrieving from the data storage unit solar power generation facility data and corresponding solar power data within a predetermined period of time, the retrieved data being related to a solar power generation facility that is the same as or similar to the solar power generation facility to be installed; and a simulation processing unit including a power consumption calculation unit configured to use the solar power data within the predetermined period of time retrieved by the data retrieval processing unit and the data regarding the energy storage system, the power load and the AC power supply system received by the data input processing unit, for calculating the amount of the power consumption by power load within a set time.

Further, the power consumption calculation unit is further configured to calculate the remaining time required for the power load to consume all the power generated by the solar power generation facility.

Further, the data retrieval processing unit calculates the statistical values of the solar power data within the predetermined period of time for a plurality of group of solar power generation facility data when two or more groups of retrieved data are related to a solar power generation facility that is the same as or similar to the solar power generation facility to be installed and the geographical region where the solar power generation facility is to be installed.

Further, the simulation processing unit further includes an hourly status processing unit configured to output the data input screen on the display unit for showing a night mode selection box and a selection box whether to use power load use for each of 24 hours, a simulation pattern time input window, a simulation start pattern input window, and operation (Run), stop (Stop) and reset (Reset) icons for the simulation operation.

The hourly status processing unit uses the data from the user input unit including the night mode selection, whether to use power load for each of 24 hours, a simulation pattern time and simulation start pattern, the data from the data retrieval processing unit including the solar power data within the predetermined period of time and the data from the data input processing unit including data regarding the energy storage system, the power load and the AC power supply system, in order to calculate the amount of solar power generation, the amount of battery charge and discharge of the energy storage system, the amount of power consumption by the power load, and the amount of consumption of power from the AC power supply system for each of the 24 hours; and output a graph on the display unit for the calculated values regarding the amount of solar power to be generated, the battery charge level of the energy storage system, the amount of power consumption by the power load, and the amount of consumption of power from the AC power supply system.

The simulation processing unit further includes a cumulative status processing unit configured to use the calculated values regarding the amount of solar power, the amount of battery charge and discharge of the energy storage system, the amount of power consumption by the power load, and the amount of consumption of power from the AC power supply for each of the 24 hours, in order to output a graph on the display unit for the calculated values regarding the accumulated amount of battery charge and discharge of the energy storage system, the accumulated amount of power consumption by the power load, and the accumulated amount of consumption of power from the AC power supply system.

According to another aspect of the present invention, there is provided a method for simulating power consumption by power load comprising the steps of: displaying a data input screen on a display unit for receiving user input data including a solar power generation facility and a geographical region where the solar power generation facility is to be installed, and data regarding energy storage system, power load and AC power supply system.

The method further comprises a step of using the user input data including the solar power generation facility and the geographical region where the solar power generation facility is to be installed in order to retrieve from the data storage unit solar power generation facility data and corresponding solar power data within a predetermined period of time, the retrieved data being related to a solar power generation facility that is the same as or similar to the solar power generation facility to be installed.

The method further comprises a step of using the retrieved solar power data within the predetermined period of time, the user input data regarding the energy storage system, the power load and the AC power supply system in order to calculate the amount of the power consumption by the power load within a set time for simulation operation.

Effect of the Invention

According to the device and method for simulating power consumption by power load of the present invention configured as described above, the following effects can be obtained.

First, the data stored in the data storage unit regarding inclined insolation and horizontal insolation, external temperature, photovoltaic module temperature, solar power generation facilities and generated solar power values corresponding to the solar power generation facilities with respect to each geographical regions is actual data measured within a certain period of time from solar power generation facilities installed in various geographical regions, in contrast to the arbitrary variables or values obtained through a mathematical simulation for a conventional solar power generation scheme.

Therefore, the device for simulating the power consumption by power load according to the present invention is configured to retrieve from the data storage unit solar power generation facility data and corresponding solar power data collected from actual solar power generation facilities within a predetermined period of time and the retrieved data is related to an actual solar power generation facility and its geographical region that is the same as or similar to the solar power generation facility to be installed by simulation and its geographical region. Then the device uses the retrieved solar power data within the predetermined period of time, the user input data regarding the energy storage system, the power load and the AC power supply system in order to calculate the amount of the power consumption by the power load within a set time for simulation operation. Therefore, the reliability of the estimation or prediction of the power consumption by the power load to be used by a user is high enough.

Second, the device for simulating the power consumption by power load according to the present invention calculates the statistical values of the solar power data within the predetermined period of time for a plurality of group of solar power generation facility data when two or more groups of data retrieved from the data storage unit are related to a solar power generation facility that is the same as or similar to the solar power generation facility to be installed and the geographical region where the solar power generation facility is to be installed. The device for simulating power consumption by power load according to the present invention uses the statistical values of the solar power data within the predetermined period of time to calculate the amount of the power consumption by the power load within the set time for simulation operation. Thus, the accuracy of the estimation or prediction of the power consumption by the power load to be used by the user is high enough.

Third, the device for simulating the power consumption by power load according to the present invention calculates the amount of solar power generation, the amount of battery charge and discharge of the energy storage system, the amount of power consumption by the power load, and the amount of consumption of power from the AC power supply system for each of the 24 hours and outputs a graph on the display unit for the calculated values regarding the calculated amount of solar power to be generated, the battery charge level of the energy storage system, the amount of power consumption by the power load, and the amount of consumption of power from the AC power supply system. Thus, the user can intuitively identify the amount of power generation, the battery charge level, the power consumption amount of the power load, and the power consumption amount of the power system for the day.

BRIEF DESCRIPTION OF DRAWINGS

The drawings accompanied by the present specification illustrate embodiments of the present invention and, together with the following detailed description of the invention, serve to more clearly understand the technical concept of the present invention. The invention should not be construed to be limited to the features described in the drawings.

BEST MODE(S) FOR CARRYING OUT THE INVENTION

The terms used herein are intended to describe certain embodiments only and shall not be interpreted to restrict the scope of the present invention. A singular expression includes a plural expression unless the context has a clearly different meaning. Terms such as 'comprising' or 'including' herein are used only to specify the presence of features, numbers, steps, operations, components, components, or combinations thereof described herein and hence it should not be understood that this does not prejudice the existence or possible addition of one or more other features or numbers, steps, operations, components, components or combinations thereof.

Unless defined otherwise, all technical and scientific terms used herein generally represents the same meaning as those generally understood by one of ordinary skill in the art to which this invention pertains. In general, the same terms as defined in the dictionary should be construed to have a meaning consistent with the meaning in the context of the related art, and should not be construed in ideal or overly formal sense unless expressly defined in the present specification.

Hereinafter, preferred embodiments of the present invention will be described in detail with reference to the accompanying drawings.

Figure 2:
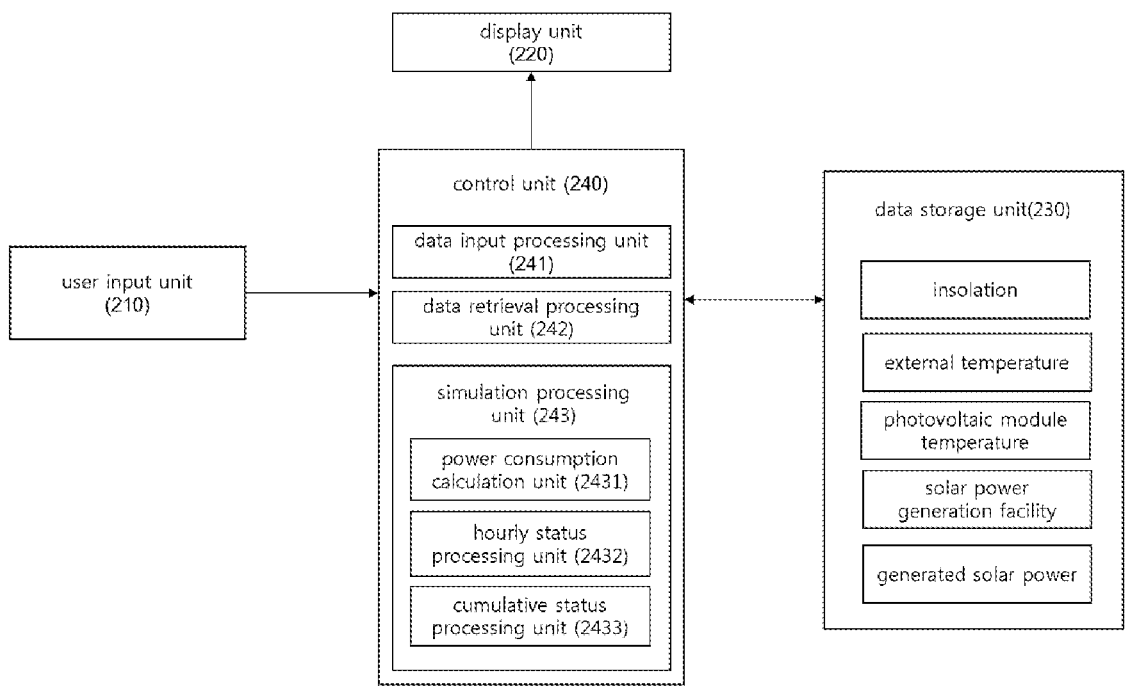
FIG. 2 is a block diagram of a simulation device 200 implemented in a computer system.

As shown in FIG. 2, the simulation device 200 according to the present invention may include a user input unit 210, a display unit 220, a data storage unit 230, and a control unit 240.

The user input unit 210 may include all types of devices and mechanisms for inputting information. These may include keyboards, keypads, mouse, scanners, digital drawing pads, touch screens display, audio input devices such as voice recognition systems, microphones and other types of possible input devices. In various embodiments, the user input unit 210 can also be implemented with a computer mouse, trackball, trackpad, joystick, wireless remote controller, drawing tablet, voice command system. The user input unit 210 allows a user to select or input an object, an icon, text, etc. appearing on the display unit 220 via a command such as a button click.

The display unit 220 may include all types of devices and mechanisms for outputting information. These can include displays (e.g., LCD or LED displays), printers, non-visual displays such as audio output devices, and the like.

The data storage unit 230 may include computer-readable media of a type configured to store an executable computer code, a human-readable code, a computer program and data. Various types of computer-readable media include floppy disks, removable hard disks, optical storage media such as CD-ROMs and DVDs, barcodes, semiconductor memories such as flash memory and read-only-memory (ROM), battery-backed volatile memory, networked storage devices, and the like.

When constructing a renewable energy system using solar power in an area desired by a user, the data storage unit 230 stores electrical power load consumption simulation programs and related data which estimates and displays the power consumption by the power load provided by the user.

The data stored in the data storage unit 230 include inclined insolation and horizontal insolation, external temperature, photovoltaic module temperature, solar power generation facility and generated solar power corresponding to the solar power generation facility measured in various geographical regions within a certain period of time. These data are actual values measured within a predetermined period of time from actual solar power generation facilities installed in each region. Therefore, the simulation device 200 according to the present invention has high reliability in predicting the power consumption by the power load provided to the user.

The control unit 240 executes the simulation program stored in the data storage unit 230 and processes the power consumption simulation by the power load using the data stored in the data storage unit 230. The control unit 240 includes a data input processing unit 241, a data retrieval processing unit 242, and a simulation processing unit 243.

The data input processing unit 241 outputs a data input screen on the display unit. The data input screen includes input windows for inputting data regarding the energy storage system (ESS), the power load, and the AC power supply system (Line). For example, the data regarding the energy storage system (ESS) includes a maximum voltage value, a minimum voltage value, a maximum current value, a maximum charging amount, and a maximum discharging amount of the battery. The data on such an energy storage system (ESS) is determined by the rated performance of the commercial product that the user intends to use. The data on the AC power system (Line) includes the maximum voltage value, the minimum voltage value, the maximum current value, and the maximum and minimum values of the frequency. Data relating to the power load includes a maximum voltage value, a minimum voltage value and a maximum current value. Such power load data is determined by the rated performance of the commercial product that the user intends to use.

The data input processing unit 241 receives, from the user input unit 210, data relating to the geographical region where the user desires to install the solar power generation facility, as well as data regarding the solar power generation facility, the energy storage system (ESS), the power load, and the power system.

The data retrieval processing unit 242 uses user input information on a solar power generation facility and a geographical region where the solar power generation facility is to be installed, in order to retrieve from the data storage unit 230 solar power generation facility data and corresponding solar power data within a predetermined period of time, the retrieved data being related to a solar power generation facility that is the same as or similar to the solar power generation facility to be installed or simulated. The data retrieval processing unit 242 also retrieves from the data storage unit 230 the corresponding solar power data 'within a predetermined time'. As used herein, "within a predetermined time" may be any of a day, a week, and a month, for example. As another example, "within a predetermined time" is a specific day (for example, August 31) among the daily data of all the years (for example, 2015 to 2017) for which the data of the solar power generation facility was measured. According to such an embodiment, the data retrieval processing unit 242 can be implemented to calculate the statistical values of the solar power data within the predetermined period of time.

Figure 1:
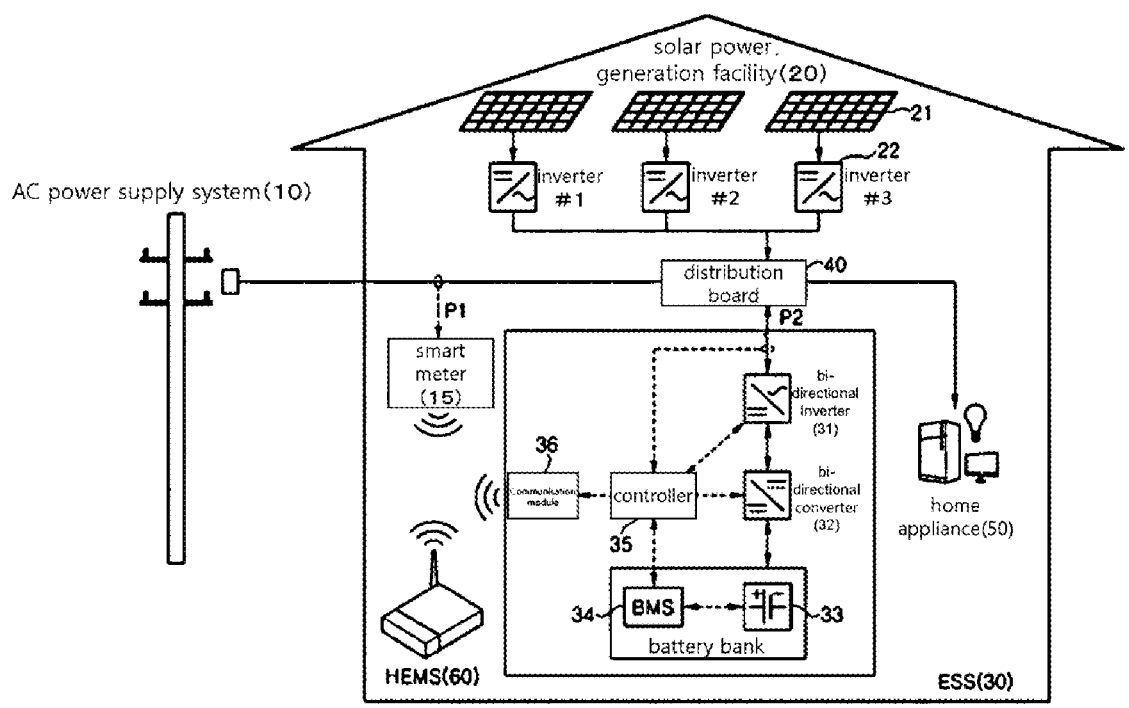
FIG. 1 is an overall configuration diagram showing an energy storage device environment based on a home energy management system.

As illustrated in FIG. 1, the solar power generation facility 20 generally includes photovoltaic modules 21 and inverters 22 connected to the D.C. output terminals of the photovoltaic module 21 to perform individual power generation. The photovoltaic module 21 of the solar power generation facility 20 can be installed as a single-stage basic type, a two-stage basic type or a multi-stage assembly type. The shape of the installation structure of the photovoltaic module 21 can be selected from a fixed type, a variable tilt angle type, a single axis tracker type or a double axis tracker type. The photovoltaic module 21 of the solar power generation facility 20 may have various types such as a single crystal type, a poly crystal type, a thin film type, a compound semiconductor type or a dye-sensitized type. Individual photovoltaic module 21 may have different model name, manufacturing company or specification. The inverter 22 of the solar power generation facility 20 may also have various model names, manufacturing companies, specifications and types such as a transformer type or a multi-string type.

The amount of power generated by solar power generation facility 20 varies depending on the type and model of the photovoltaic module 21 and related shape of installation structure. Further, the amount of power varies depending on the type, number, model and manufacturer of the inverters 22. Of course, the amount of power also varies depending on environmental conditions such as the amount of insolation in the installed area and the external temperature.

The device for simulating power consumption by power load according to the present invention retrieves stored actual solar power generation facility data of a geographical region that is the same as or similar to the geographical region in which the solar power generation facility is to be installed or simulated by the user and corresponding solar power data within. Thus, the reliability in predicting the power consumption by the power load provided by the user becomes high enough.

The data retrieval processing unit 242 calculates the statistical values of the solar power data within the predetermined period of time for a plurality of group of solar power generation facility data when two or more groups of data retrieved from the data storage unit 230 are related to a solar power generation facility that is the same as or similar to the solar power generation facility to be installed and the geographical region where the solar power generation facility is to be installed.

The simulation processing unit 243 includes a power consumption calculation unit 2431. The power consumption calculation unit 2431 uses the solar power data within the predetermined period of time retrieved by the data retrieval processing unit 242 and the data regarding the energy storage system (ESS), the power load and the AC power supply system received by the data input processing unit, in order to calculate the amount of the power consumption by power load within a set time for simulation operation. In the present specification, the "set time" may be, for example, any one of a day, a week and a month.

For example, the power consumption calculation unit 2431 can be further configured to calculate the remaining time required for the power load to consume all the power generated by the solar power generation facility. According to such an embodiment, the user can intuitively identify the simulation results including, for example, the amount of power generation, the battery charge level, the power consumption amount of the power load, and the power consumption amount of the power system for the day.

The simulation processing unit 243 further includes an hourly status processing unit 2432. The hourly status processing unit 2432 outputs a data input screen on the display unit 220 for receiving information required to generate data regarding amount of solar power generation, the amount of battery charge and discharge of the energy storage system, the amount of power consumption by the power load, and the amount of consumption of power from the AC power supply system. The data input screen, for example, shows a night mode selection box and a selection box whether to use power load use for each of 24 hours, a simulation pattern time input window, a simulation start pattern input window, and operation (Run), stop (Stop) and reset (Reset) icons for the simulation operation, as indicated by reference numerals 311 and 311-1 in FIG. 3. The power load may include LED device, refrigerator, washing machine, air conditioner, water purifier, electric fan, boiler, and the like. Thus, a plurality of input window for selecting whether to use each power load can be provided in accordance with the number of the power loads.

The night mode selection box for each of 24 hours allows the user to select the time to operate the solar power generation facility. As another example, as described above, the data retrieval processing unit 242 uses the user input data on the solar power generation facility and the geographical region where the solar power generation facility is to be installed, in order to retrieve from the data storage unit 230 the stored solar power generation facility data and corresponding solar power data within a predetermined period of time, the retrieved data being related to a solar power generation facility that is the same as or similar to the solar power generation facility to be installed. Accordingly, the hourly status processing unit 2432 can be implemented to automatically select whether to run the solar power generation facility by using the retrieved solar power data within the predetermined period of time.

The number input in the simulation pattern time input window means a time period for displaying the results of simulation in a graph. For example, any number from "1 minute" to "60 minutes" may be input. If "1 minute" is input on the simulation pattern time input window, the graphs in FIGS. 313 and 314 change every minute. The start pattern input window allows the user to select the start time of simulation during the 24 hours for displaying the result as the graphs 313 or 314.

The hourly status processing unit 2432 uses the data from the user input unit 210 including the night mode selection, whether to use power load for each of 24 hours, a simulation pattern time and simulation start pattern, the data from the data retrieval processing unit 242 including the solar power data within the predetermined period of time, and data from the data input processing unit 241 including data regarding the energy storage system, the power load and the AC power supply system, in order to calculate the amount of solar power generation, the amount of battery charge and discharge of the energy storage system (ESS), the amount of power consumption by the power load, and the amount of consumption of power from the AC power supply system for each of the 24 hours.

Figure 3:
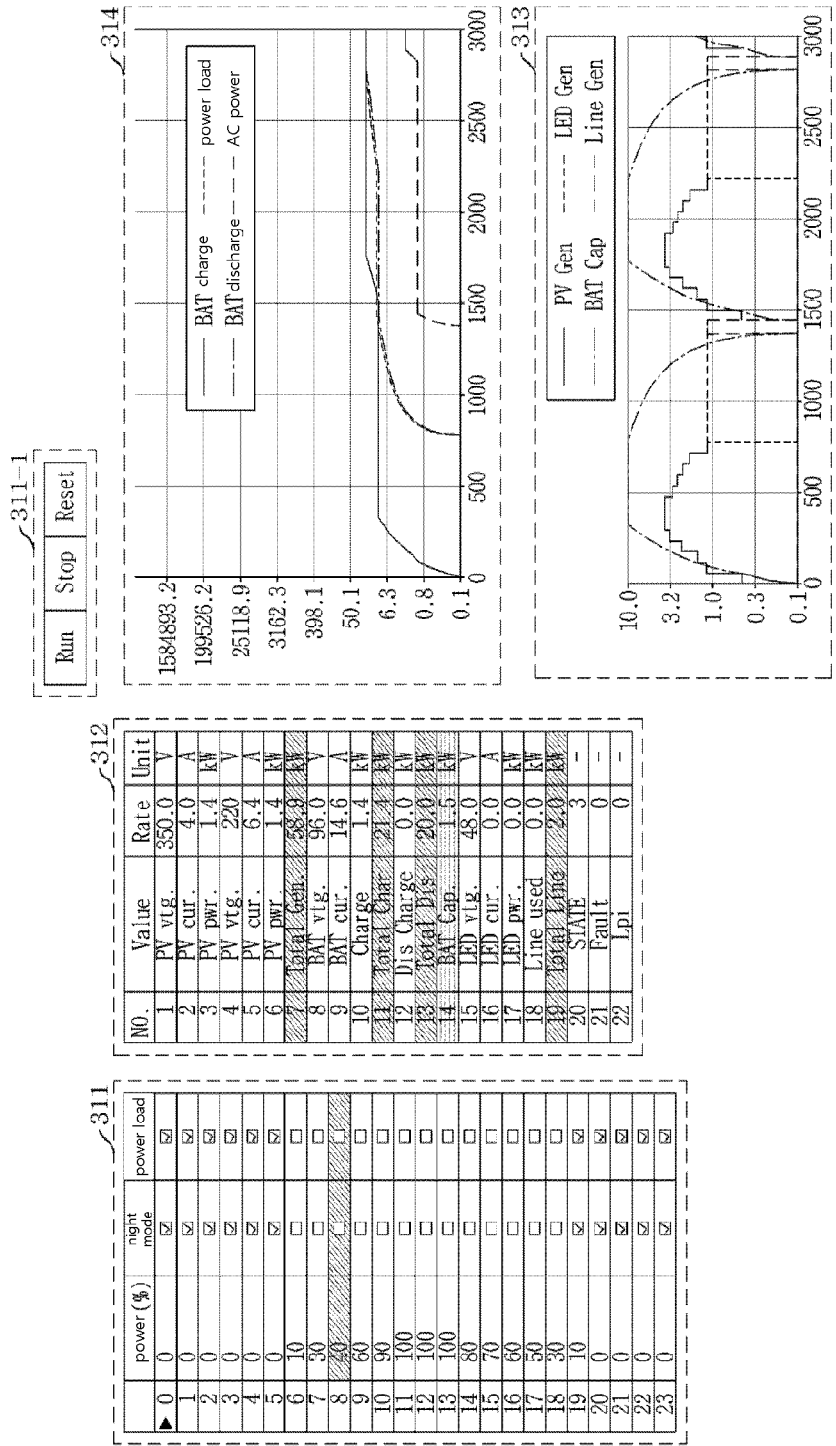
FIG. 3 is an exemplary diagram for explaining an input screen and a graph for generating data relating to an amount of power generation, a battery charge level, an amount of power consumption by a power load, and an amount of consumption of power from the AC power supply system.

Reference numeral 312 in FIG. 3 refers to a state table showing calculation results on a screen regarding power generation, power charging and consumption, and use of power from power system in a specific hour or stage (i.e., 8th stage in table 311). For example, items in state table 312 include the voltage, current and power generated from the solar power (PV) generation facility, the grid voltage, current and power from the AC power supply system (Line), the cumulative power generation (Total Gen), and the voltage and current flowing through the energy storage system (ESS), real-time and cumulative amounts of the battery charge and discharge (Charge, Discharge), the battery charge level (BAT Cap.), the voltage and current flowing to the power load (LED vtg, LED cur.), and the real-time power consumption by the power load (LED pwr.), and real-time and accumulated amount of power from the AC power supply system (Line used, Total Line).

The hourly status processing unit 2432 outputs a graph 313 in FIG. 3 on the display unit 220 for the calculated values regarding the amount of the solar power to be generated, the battery charge level of the energy storage system, the amount of power consumption by the power load, and the amount of consumption of power from the AC power supply system. The horizontal axis of the graph 313 in FIG. 3 is time (the unit may be "second" or "minute"), and the vertical axis includes the calculated amount of power generation, the battery charge level, the amount of power consumption by the power load, and the amount of consumption of power from the AC power supply system.

The simulation processing unit 243 further includes a cumulative status processing unit 2433. The cumulative status processing unit 2433 uses values, calculated by the hourly status processing unit 2432, regarding the amount of solar power to be generated, the amount of battery charge and discharge of the energy storage system, the amount of power consumption by the power load, and the amount of consumption of power from the AC power supply for each of the 24 hours, in order to output a graph 314 in FIG. 3 on the display unit 20 for the calculated values regarding the accumulated amount of battery charge and discharge of the energy storage system, the accumulated amount of power consumption by the power load, and the accumulated amount of consumption of power from the AC power supply system. The horizontal axis of the graph 314 in FIG. 3 is time (the unit may be "second" or "minute"), and the vertical axis includes the accumulated amount of battery charge and discharge of the energy storage system, the accumulated amount of power consumption by the power load, and the accumulated amount of consumption of power from the AC power supply system.

Figure 4:
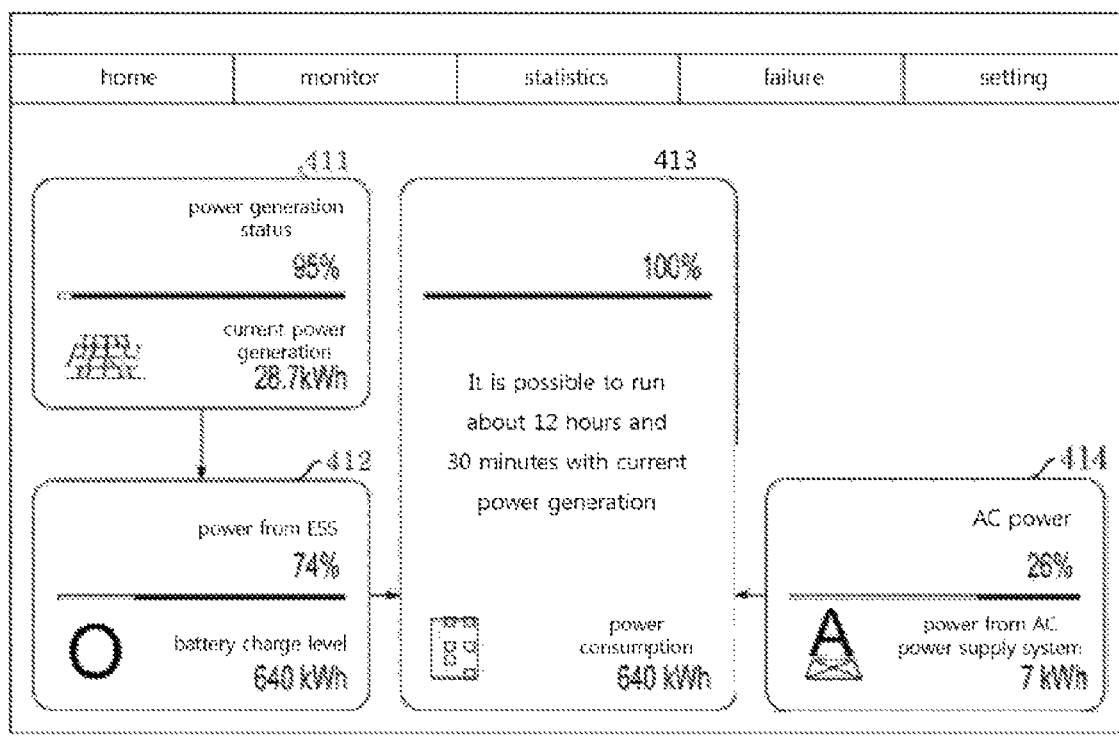
FIG. 4 is an exemplary diagram for explaining a data screen showing calculation results with respect to an amount of power generation, a battery charge level, an amount of power consumption by a power load, and an amount of consumption of power from the AC power supply system.

As shown in FIG. 4, the simulation processing unit 243 may graphically display on the screen the calculation results regarding the amount of power generation, the battery charge level, the amount of power consumption by the power load, and the amount of use of power from the AC power supply system so that the user can intuitively identify the results. The reference numeral 411 in FIG. 4 indicates an area that represents the amount of real-time power generation of the solar power generation facility and the ratio of the real-time to the maximum power generation. Reference numeral 412 of FIG. 4 indicates an area that represents the amount of a battery charge of the energy storage system (ESS) and the ratio of the power load empowered by the battery of the energy storage system (ESS) in percentage (%). Reference numeral 413 in FIG. 4 is an area showing the amount of power consumption when the entire power load is operated at 100% and the remaining time during which the power loads consumes the accumulated power energy. Reference numeral 414 in FIG. 4 is an area that shows the amount of power from the AC power supply system and the ratio of the power load empowered by the AC power supply system in percentage (%).

Figure 5:
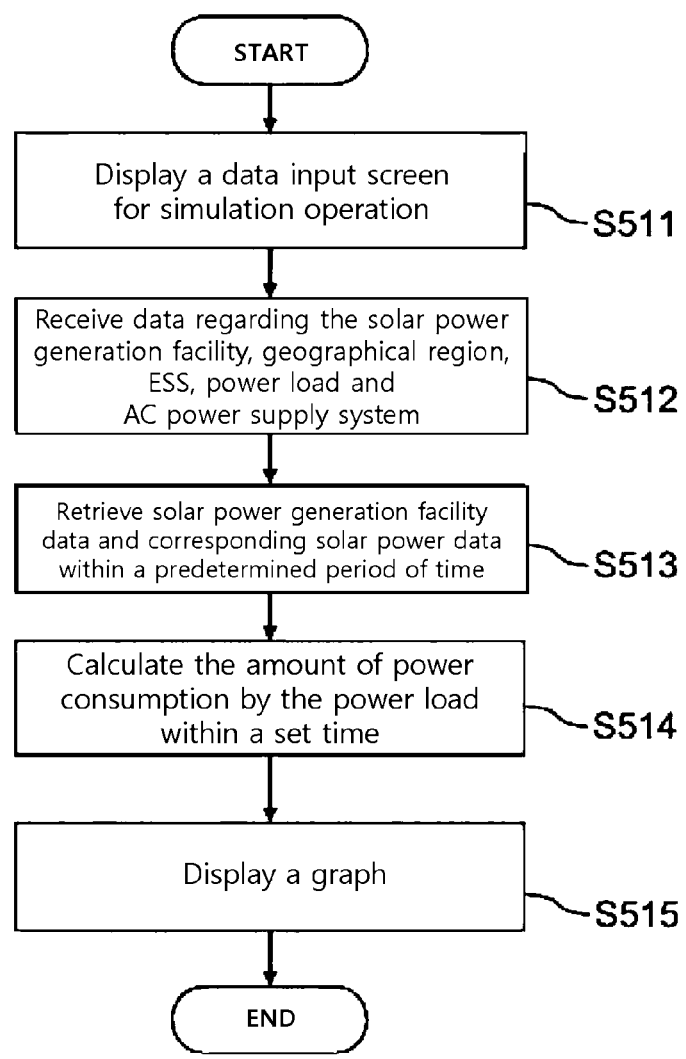
FIGS. 5 and 6 illustrate a processor for simulating power consumption by power load according to the present invention.
Figure 6:
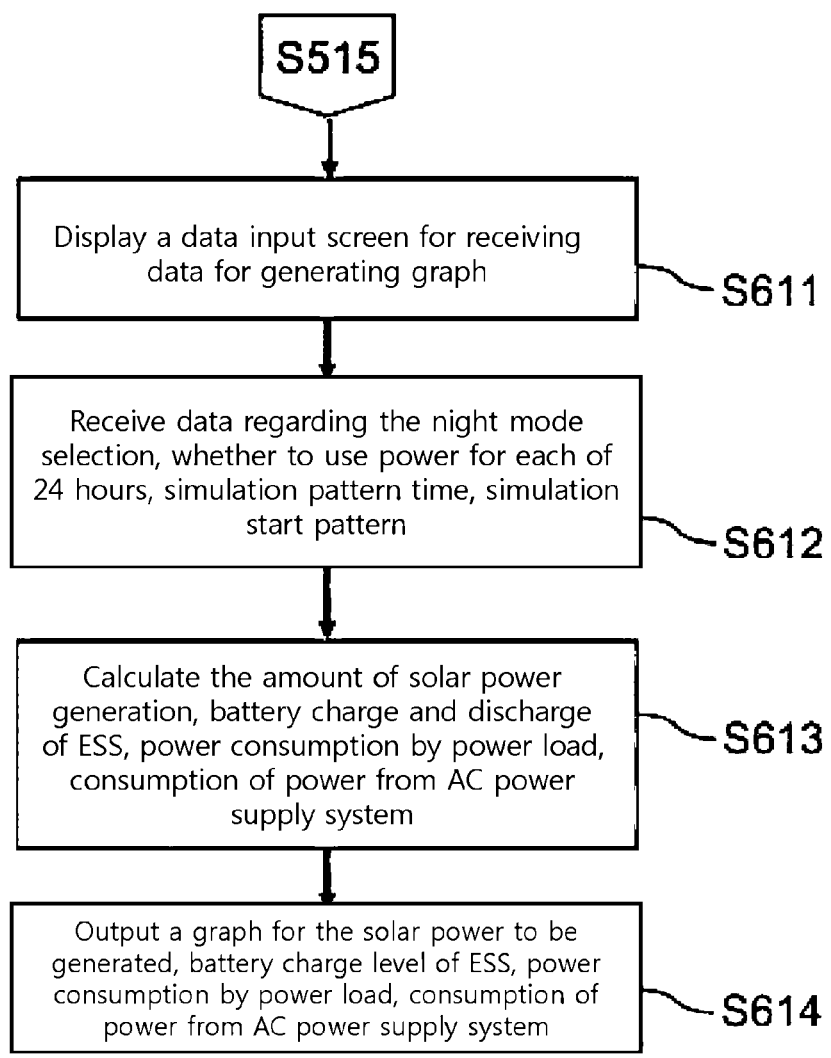

FIGS. 5 and 6 illustrate a simulation process by a processor for simulating power consumption by power load according to the present invention. For the purpose of understanding, the processor may be implemented as one of the components of the device in FIG. 2, but it should be understood the present invention shall not be limited to the exemplary device described with reference to FIG. 2. The processor for simulating power consumption by power load may be configured to execute a set of instructions (e.g., codes) contained in a computer-readable recording medium. These instructions may be configured to be implemented in order, or in parallel (e.g., under different processing threads), or a combination thereof. For the purpose of understanding, the processor will be described with reference to FIG. 2, but it should be understood the embodiment of the processor is not limited to the exemplary system or device described with reference to FIG. 2.

First, the processor for simulating the power consumption by power load displays a data input screen to the display unit at step S511. For example, the data input screen includes input windows for inputting data regarding energy storage system (ESS), power load, and power system (Line). For example, the data regarding the energy storage system (ESS) includes maximum and minimum voltage values, a maximum current value, and maximum charging and discharging amounts of the battery. The data on such an energy storage system (ESS) is determined by the rated performance of the commercial product that the user intends to use. The data relating to the AC power supply system (Line) includes maximum and minimum voltage values, a maximum current value, and maximum and minimum values of frequency. The data relating to the power load includes maximum and minimum voltage values and a maximum current value. Such power load data is determined by the rated performance of the commercial product that the user intends to use.

After step S511, the processor for simulating the power consumption by power load receives from the user input unit 210 data relating to a solar power generation facility, a geographical region where the user desires to install the solar power generation facility, an energy storage system (ESS), power loads and an AC power supply system at step S512.

After step S512, the processor for simulating the power consumption by power load uses the data on the solar power generation facility and a geographical region where the solar power generation facility is to be installed in order to retrieve from the data storage unit 230 the stored solar power generation facility and its region data that is the same as or similar to the solar power generation facility to be installed and its region as well as corresponding solar power data for a predetermined period of time at step S513. As used herein, the "predetermined period of time" may be any of a day, a week, and a month, for example. As another example, the predetermined time may be a specific day (for example, August 31) among the daily data of all the years (for example, 2015 to 2017) for which the data for solar power generation facility was measured. According to such an embodiment, the data retrieval processing unit 242 can be implemented to calculate the statistical values of the solar power data within the predetermined period of time.

After step S513, the processor for simulating the power consumption by power load uses the solar power data within the predetermined period of time retrieved in step S513 and the data regarding the energy storage system (ESS), the power load and the AC power supply system received in step S512 in order to calculate the amount of power consumption by the power load with a set time for simulation operation at step S514. The power consumption calculation unit 2431 uses the solar power data within the predetermined period of time retrieved by the data retrieval processing unit 242 and the data regarding the energy storage system (ESS), the power load and the AC power supply system received by the data input processing unit, in order to calculate the amount of the power consumption by power load within a set time for simulation operation. In the present specification, the "set time" may be, for example, any one of a day, a week and a month.

For example, the power consumption calculation unit 2431 can be further configured to calculate the remaining time required for the power load to consume all the power generated by the solar power generation facility. According to such an embodiment, the user can intuitively identify the simulation results including, for example, the amount of power generation, the battery charge level, the power consumption amount of the power load, and the power consumption amount of the power system for the day.

After step S514, the processor for simulating the power consumption by power load calculates graph data with respect to the calculated power generation, the battery charge level, the power consumption by power load, and the power consumption of the system power supply, and displays the data on the display unit at step S515.

Hereinafter, the step S515 will be described in detail with reference to FIG. 6. The processor for simulating the power consumption by power load outputs a data input screen on the display unit 220 for receiving information required to generate data regarding the amount of power generation, the battery charge level, the amount of power consumption by the power load, and the amount of consumption of power from the AC power supply system at step S611. The data input screen, for example, shows a night mode selection box and a selection box whether to use power load use for each of 24 hours, a simulation pattern time input window, a simulation start pattern input window, and operation (Run), stop (Stop) and reset (Reset) icons for the simulation operation, as indicated by reference numerals 311 and 311-1 in FIG. 3. The power loads may include LED device, refrigerator, washing machine, air conditioner, water purifier, electric fan, boiler, and the like. Thus, a plurality of input screens for selecting each power load can be provided in accordance with the number of power loads.

The night mode selection box for each of 24 hours allows the user to select the time to operate the solar power generation facility. As another example, as described above, the data retrieval processing unit 242 uses the user input data on the solar power generation facility and the geographical region where the solar power generation facility is to be installed, in order to retrieve from the data storage unit 230 the stored solar power generation facility data and corresponding solar power data within a predetermined period of time, the retrieved data being related to a solar power generation facility that is the same as or similar to the solar power generation facility to be installed. Accordingly, the hourly status processing unit 2432 can be implemented to automatically select whether to run the solar power generation facility by using the retrieved solar power data within the predetermined period of time.

The number input in the simulation pattern time input window means a time period for displaying the results of simulation in a graph. For example, any number from "1 minute" to "60 minutes" may be input. If "1 minute" is input on the simulation pattern time input window, the graphs in FIGS. 313 and 314 change every minute. The start pattern input window allows the user to select the start time of simulation during the 24 hours for displaying the result as the graphs 313 or 314.

After step S611, the processor for simulating the power consumption by power load receives from the user input unit 210 the input data including night mode selection, the use of power load, simulation pattern time and simulation start pattern at step S612.

After the step S612, the processor for simulating the power consumption by power load uses the data regarding the night mode selection, whether to use power load for each of 24 hours, simulation pattern time and simulation start pattern received at step S612, the solar power data within the predetermined period of time retrieved at step S513 and the data regarding the energy storage system (ESS), the power load, and the AC power supply system received at step S512, in order to calculate the amount of solar power generation, the amount of battery charge and discharge of the energy storage system (ESS), the amount of power consumption by the power load, and the amount of consumption of power from the AC power supply system for each of the 24 hours at step S613.

After step S613, the processor for simulating the power consumption by power load generates a graph such as the reference numeral 313 in FIG. 3 and outputs the graph on the display unit 220 for the calculated values regarding the amount of solar power to be generated, the battery charge level of the energy storage system, the amount of power consumption by the power load, and the amount of consumption of power from the AC power supply system at step S614. The horizontal axis of the graph 313 in FIG. 3 is time (the unit may be "second" or "minute"), and the vertical axis includes the calculated amount of power generation, the battery charge level, the amount of power consumption by the power load, and the amount of consumption of power from the AC power supply system.

Although not shown, the processor for simulating the power consumption by power load uses the values regarding the amount of generated solar power, the amount of battery charge and discharge of the energy storage system, the amount of power consumption by the power load, and the amount of consumption of power from the AC power supply for each of the 24 hours, in order to output a graph for the calculated values regarding the accumulated amount of battery charge and discharge of the energy storage system, the accumulated amount of power consumption by the power load, and the accumulated amount of consumption of power from the AC power supply system.

The present invention described above is not limited to the above-described embodiment and the accompanying drawings, and various substitutions, modifications, and changes can be made without departing from the technical idea of the present invention. This will be apparent to those of ordinary skill in the art to which this invention belongs. Accordingly, the technical scope of the present invention should be determined only by the appended claims.

INDUSTRIAL APPLICABILITY

The present invention can be used in the electric power industry.

The invention claimed is:

1. A device for simulating power consumption by power load comprising:
   a user input unit for receiving user instructions;
   a display unit;
   a data storage unit for storing data including inclined insolation and horizontal insolation, external temperature, photovoltaic module temperature, solar power generation facility and generated solar power corresponding to the solar power generation facility measured in various geographical regions within a certain period of time;
   a data input processing unit for outputting a data input screen on the display unit and receiving data regarding energy storage system, power load and AC power supply system from the user input unit;
   a data retrieval processing unit configured to use information on a solar power generation facility and a geographical region where the solar power generation facility is to be installed, for retrieving from the data storage unit solar power generation facility data and corresponding solar power data within a predetermined period of time, the retrieved data being related to a solar power generation facility that is the same as or similar to the solar power generation facility to be installed; and
   a simulation processing unit including a power consumption calculation unit configured to use the solar power data within the predetermined period of time retrieved by the data retrieval processing unit and the data regarding the energy storage system, the power load and the AC power supply system received by the data input processing unit, for calculating the amount of the power consumption by power load within a set time.

2. The device for simulating power consumption by power load according to claim 1, wherein:
   the power consumption calculation unit is further configured to calculate the remaining time required for the power load to consume all the power generated by the solar power generation facility.

3. The device for simulating power consumption by power load according to claim 1, wherein:
   the data retrieval processing unit calculates the statistical values of the solar power data within the predetermined period of time for a plurality of group of solar power generation facility data when two or more groups of retrieved data are related to a solar power generation facility that is the same as or similar to the solar power generation facility to be installed and the geographical region where the solar power generation facility is to be installed.

4. The device for simulating power consumption by power load according to claim 1, wherein the simulation processing unit further includes an hourly status processing unit configured to:
   output the data input screen on the display unit for showing a night mode selection box and a selection box whether to use power load use for each of 24 hours, a simulation pattern time input window, a simulation start pattern input window, and operation (Run), stop (Stop) and reset (Reset) icons for the simulation operation;
   use the data from the user input unit including the night mode selection, whether to use power load for each of 24 hours, a simulation pattern time and simulation start pattern, the data from the data retrieval processing unit including the solar power data within the predetermined period of time and data from the data input processing unit including data regarding the energy storage system, the power load and the AC power supply system, in order to calculate the amount of solar power generation, the amount of battery charge and discharge of the energy storage system, the amount of power consumption by the power load, and the amount of consumption of power from the AC power supply system for each of the 24 hours; and
   output a graph on the display unit for the calculated values regarding the amount of the solar power to be generated, the battery charge level of the energy storage system, the amount of power consumption by the power load, and the amount of consumption of power from the AC power supply system.

5. The device for simulating power consumption by power load according to claim 4, wherein the simulation processing unit further includes a cumulative status processing unit configured to:
   use the calculated values regarding the amount of generated solar power, the amount of battery charge and discharge of the energy storage system, the amount of power consumption by the power load, and the amount of consumption of power from the AC power supply for each of the 24 hours, in order to output a graph on the display unit for the calculated values regarding the accumulated amount of battery charge and discharge of the energy storage system, the accumulated amount of power consumption by the power load, and the accumulated amount of consumption of power from the AC power supply system.

6. A method for simulating power consumption by power load comprising the steps of:
displaying a data input screen on a display unit for receiving user input data including a solar power generation facility and a geographical region where the solar power generation facility is to be installed, and data regarding energy storage system, power load and AC power supply system;
using the user input data including the solar power generation facility and the geographical region where the solar power generation facility is to be installed in order to retrieve from the data storage unit solar power generation facility data and corresponding solar power data within a predetermined period of time, the retrieved data being related to a solar power generation facility that is the same as or similar to the solar power generation facility to be installed; and
using the retrieved solar power data within the predetermined period of time, the user input data regarding the energy storage system, the power load and the AC power supply system in order to calculate the amount of the power consumption by the power load within a set time for simulation operation.

7. The method for simulating power consumption by power load according to claim 6 further comprising the steps of:
displaying a data input screen for showing a night mode selection box and a selection box whether to use power load for each of 24 hours, a simulation pattern time input window, a simulation start pattern input window, and operation (Run), stop (Stop) and reset (Reset) icons for the simulation operation;
receiving data including the night mode selection, whether to use power load for each of 24 hours, a simulation pattern time and simulation start pattern;
using the data including the simulation pattern time and simulation start pattern data, the retrieved solar power data within the predetermined period of time and the data regarding the energy storage system, the power load and the AC power supply system, in order to calculate the amount of solar power generation, the amount of battery charge and discharge of the energy storage system, the amount of power consumption by the power load, and the amount of consumption of power from the AC power supply system for each of the 24 hours; and
displaying a graph for the calculated values regarding the amount of solar power generation, the battery charge level of the energy storage system, the amount of power consumption by the power load, and the amount of consumption of power from the AC power supply system.

8. The method for simulating power consumption by power load according to claim 7 further comprising the step of:
using the calculated values regarding the amount of solar power generation, the amount of battery charge and discharge of the energy storage system, the amount of power consumption by the power load, and the amount of consumption of power from the AC power supply for each of the 24 hours, in order to display a graph for the calculated values regarding the accumulated amount of battery charge and discharge of the energy storage system, the accumulated amount of power consumption by the power load, and the accumulated amount of consumption of power from the AC power supply system.

* * * * *